(12) United States Patent
Lam et al.

(10) Patent No.: US 9,466,463 B1
(45) Date of Patent: *Oct. 11, 2016

(54) CHARGED PARTICLE BEAM SUBSTRATE INSPECTION USING BOTH VECTOR AND RASTER SCANNING

(71) Applicant: Mutibeam Corporation, Santa Clara, CA (US)

(72) Inventors: David K. Lam, Saratoga, CA (US); Kevin M. Monahan, Cupertino, CA (US); Enden David Liu, Palo Alto, CA (US); Cong Tran, San Jose, CA (US); Theodore A. Prescop, San Jose, CA (US)

(73) Assignee: Multibeam Corporation, Santa Clara, CA (US)

( * ) Notice: Subject to any disclaimer, the term of this patent is extended or adjusted under 35 U.S.C. 154(b) by 93 days.

This patent is subject to a terminal disclaimer.

(21) Appl. No.: 14/085,768

(22) Filed: Nov. 20, 2013

Related U.S. Application Data

(60) Provisional application No. 61/728,311, filed on Nov. 20, 2012, provisional application No. 61/900,393, filed on Nov. 5, 2013.

(51) Int. Cl.
*H01J 49/00* (2006.01)
*H01J 37/28* (2006.01)
*H01J 37/317* (2006.01)

(52) U.S. Cl.
CPC ............ *H01J 37/28* (2013.01); *H01J 37/3177* (2013.01)

(58) Field of Classification Search
USPC ........................................... 250/307
See application file for complete search history.

(56) References Cited

U.S. PATENT DOCUMENTS

| | | | | |
|---|---|---|---|---|
| 5,557,105 A * | 9/1996 | Honjo | ..................... | H01J 37/04 250/310 |
| 7,135,676 B2 * | 11/2006 | Nakasuji | .............. | G01N 23/225 250/307 |
| 8,536,526 B2 * | 9/2013 | Bell | ..................... | G01R 31/307 250/306 |
| 2010/0072365 A1 * | 3/2010 | Shoham | ............. | G01N 23/2208 250/307 |

* cited by examiner

*Primary Examiner* — Phillip A Johnston
(74) *Attorney, Agent, or Firm* — Seth A. Horwitz

(57) ABSTRACT

The present application discloses methods, systems and devices for using charged particle beam tools to inspect and perform lithography on a substrate using a combination of vectoring to move a beam to features to be imaged, and raster scanning to obtain an image of the feature(s). The inventors have discovered that it is highly advantageous to use an extra step, a fast raster scan to image the substrate at a lower resolution, to determine which features receive priority for inspection; this extra step can reduce total inspection time, enhance inspection results, and improve beam alignment and manufacturing yield. Using multiple beam-producing columns, with multiple control computers local to the columns, provides various synergies. Preferably, miniature, non-magnetic, electrostatically-driven columns are used.

13 Claims, 20 Drawing Sheets

CHARGED PARTICLE BEAM SUBSTRATE INSPECTION USING BOTH VECTOR AND RASTER SCANNING

CROSS-REFERENCE

Priority is claimed from U.S. Provisional App. No. 61/728,311 filed Nov. 20, 2012, which is hereby incorporated by reference.

Priority is claimed from U.S. Provisional App. No. 61/900,393 filed Nov. 5, 2013, which is hereby incorporated by reference.

BACKGROUND

The present application relates to systems, devices and methods for substrate inspection using charged particle beams.

Note that the points discussed below may reflect the hindsight gained from the disclosed inventions, and are not necessarily admitted to be prior art.

Defect inspection of semiconductor wafers and masks for IC manufacturing is an accepted production process for yield enhancement. The information obtained from a wafer defect inspection tool can be used, for example, to flag defective wafers for reprocessing or discarding, or to correct wafer processing parameters.

Various charged particle beam technologies can be suitable for wafer inspection, including electron beam, focused ion beam, and masked ion beam systems. Inspection uses beam powers low enough not to significantly affect the wafer surface (i.e., low enough not to create a feature or defect).

Electron beam inspection systems, for example, typically comprise an electron beam column and a stage to hold and transport the wafer being inspected. The electron beam column generally comprises an electron source, which emits electrons that are collimated and accelerated along the central axis of the column, and an electron-optical column, which consists of one or more electrostatic deflectors as well as one or more focusing lenses that aim the beam at the targeted area on the substrate.

A stage can be positioned using precise location information obtained using, for example, laser interferometry.

Generally, wafer inspection using a charged particle beam is performed by raster scanning the beam across the wafer surface. In raster scanning, the charged particle beam is deflected repetitively back and forth over the wafer, and is incrementally moved—by deflection, movement of the stage, or both—in a roughly orthogonal direction relative to the wafer as each long stripe is completed (i.e., moving much like the electron gun raster scan used to generate a typical cathode ray tube television image).

Vector scanning is another known method of moving a charged particle beam across a wafer surface. In vector scanning, the charged particle beam is deflected, sequentially, directly to the features to be inspected.

Defect recognition is typically achieved by "die-to-die" data comparison, or image-to-design comparison. Generally, wafers are removed from vacuum following electron beam lithography and transferred to a defect inspection system for the purpose of inspection and review of defects.

Single beam and multiple beam charged particle beam inspection systems have also been proposed. For example, single column and multiple column electron beam designs, in which a column emits a single electron beam, include multiple physically separate electron beam columns clustered together.

One use for charged particle beams is electron beam lithography, in which electron beams pattern features at high resolution.

SUMMARY

The present application discloses systems, devices and methods for inspecting a patterned substrate with a charged particle beam using both vector scanning and raster scanning. To inspect a feature, the beam is vectored to (or near to) the feature, and then rastered across the feature to obtain an image of the substrate.

Surprisingly, the inventors have discovered that it is highly desirable to scan the substrate twice. One, the charged particle beam is quickly raster scanned across the substrate to inspect the substrate in coarse detail to identify features requiring detailed inspection. Two (repeatable to inspect multiple identified features), the beam is vectored to a "care-area" containing an identified feature and rastered across the feature to inspect the substrate in fine detail. The "care-area" can be sized based on a design layout template corresponding to the wafer being inspected. (The design layout template is also sometimes called the design database herein.)

The combination of vector scanning and raster scanning also shows significant advantages in lithography.

Embodiments utilizing multiple charged particle beam columns, particularly when using column control computers local to the columns, realize advantageous synergies with respect to the disclosed inventions.

Defects can be detected by comparing the die image to the design layout database, or to a stored image of a (corresponding feature on a) known-good die, or to two or more images in a "voting" scheme to detect an abnormal image.

Qualification and monitoring of a charged particle beam lithography tool can be performed by a charged particle beam inspection tool that can share significant design characteristics with the lithography tool.

Charged particle beam alignment for lithography and/or inspection can advantageously use vectoring to move the beam to a target substrate region and rastering the beam to obtain images of alignment marks.

Critical dimension control can be improved by vectoring a charged particle beam to critical dimension control targets, rastering across and imaging the targets, and analyzing the resulting images.

BRIEF DESCRIPTION OF THE DRAWINGS

The disclosed inventions will be described with reference to the accompanying drawings, which show important sample embodiments and which are incorporated in the specification hereof by reference, wherein.

DETAILED DESCRIPTION OF SAMPLE EMBODIMENTS

Figure 1:
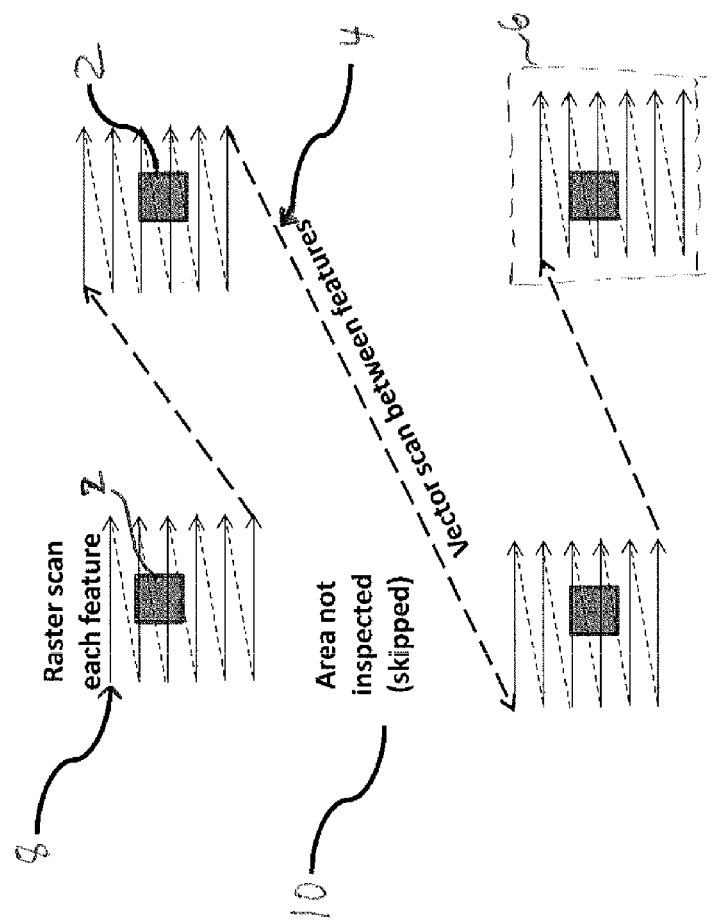
FIG. 1 schematically shows an example of inspection using a charged particle beam.

The numerous innovative teachings of the present application will be described with particular reference to presently preferred embodiments (by way of example, and not of limitation). The present application describes several inventions, and none of the statements below should be taken as limiting the claims generally.

The present application discloses systems, devices and methods for inspecting a patterned substrate with a charged particle beam using both vector scanning (also referred to herein as vectoring) and raster scanning (also referred to herein as rastering). To inspect a feature, the beam is vectored to (or near to) the feature, and then raster scanned across the feature to image the substrate.

Surprisingly, the inventors have discovered that it is highly desirable to scan the substrate twice to inspect a substrate. One, the charged particle beam is quickly rastered across the substrate to image the substrate in coarse detail to identify features requiring detailed inspection (e.g., because they contain a defect or likely defect). Two (repeatable to inspect multiple identified features), the beam is vectored to a "care-area" containing an identified feature (or defect) and rastered across the feature to obtain an image of the substrate in fine detail. Broadly, a "care-area" is a region on the substrate that warrants detailed inspection. The "care-area" can be sized based on a design layout template corresponding to the wafer being inspected.

The combination of vector scanning and raster scanning also shows significant advantages in lithography.

Embodiments utilizing multiple charged particle beam columns, particularly when using multiple column control computers local to the columns, realize advantageous synergies with respect to the disclosed inventions.

Defects can be detected by comparing the die image to the design layout database, or to a stored image of a (corresponding feature on a) known-good die, or to two or more images in a "voting" scheme to detect an abnormal image.

Qualification and monitoring of a charged particle beam lithography tool can be performed by a charged particle beam inspection tool that shares significant design characteristics with the lithography tool.

Charged particle beam alignment for lithography and/or inspection can advantageously include using vectoring to move the beam to a target wafer region and rastering the beam to locate alignment marks.

Critical dimension control can be improved by vectoring a charged particle beam to critical dimension control targets, rastering across and imaging the targets, and analyzing the resulting images.

The disclosed innovations, in various embodiments, provide one or more of at least the following advantages. However, not all of these advantages result from every one of the innovations disclosed, and this list of advantages does not limit the various claimed inventions.

Enables defect and critical feature identification and review in the same tool and in the same vacuum space;
faster substrate inspection;
shorter substrate inspection turnaround time;
lower sample density per beam column;
lower bandwidth requirements among beam columns, beam control computers and defect analysis computer(s);
lower per-processor image processing requirements;
simplifies image data handling;
lower inspection energy use;
improved substrate inspection accuracy;
faster lithography tool qualification;
improved beam accuracy for inspection and lithography;
simpler stage and column calibration; and
fewer substrate defects.

The present application discloses new approaches to quickly and accurately inspect wafer features, such as contact holes and line cut features, using charged particle beams. A fast raster scan of the beam across the wafer surface at a relatively low resolution is used to detect features that are defective or otherwise require more detailed inspection. Then, features are inspected at a relatively high resolution by vectoring a charged particle beam directly to a "care-area" containing the feature, and rastering the beam across the care-area to image the target feature.

Typically, less than 10% of wafer area of certain wafer layers contains cut features (e.g., line cuts and contact holes), the primary features produced by lithography of these wafer layers that require inspection. Vectoring the beam to skip areas that do not require inspection can reduce fine detail inspection time by a factor of 10 or more; the initial fast raster scan can net even more gains, as features that are clearly not defective are quickly pruned from the list of features to examine in finer detail.

A "care-area" is defined as a wafer region that contains one or multiple features, selected from the total list of features; selection indicates the care-area (and thus, the feature(s) it contains) is to be inspected in fine detail to determine whether the selected feature is defective (and has been identified as requiring such fine detail inspection). A care-area is sized so that raster scanning across the care-area does not waste significant inspection time on wafer area that does not contain a feature selected for inspection, and to reliably contain the respective selected feature. A care-area can be minimally sized to contain the feature within size, shape and location tolerances of that feature. Tolerances can be specified by or derived from the design layout template. A single care-area can contain multiple features if they are sufficiently densely spaced.

Features are selected for fine detail inspection if they have been determined to have an elevated risk of defects as a result of a (lower resolution) fast raster scan, or are critical features.

If a feature was written correctly, its size and location is known from the design database corresponding to the patterned wafer, and can be within tolerances depending primarily on the design layout template. This allows the beam to vector directly to a target feature or care-area.

Care-area images (or feature images) can be compared to images of features (or care-areas containing features), to composite images of known-good features, or to the design layout template.

The fast raster scan phase produces images with a larger pixel size (a lower magnification) than the vector scan plus raster scan phase. The larger pixel size generally corresponds to an electron beam focused to cover a larger area of the wafer at the beam-wafer intersection. The fast raster scan phase can pass the substantial majority of actually-good features and subtract them from the list of features to be inspected at finer detail, while falsely passing few or no defective features. This ability to drastically, quickly and accurately prune the set of features to be more closely inspected saves total inspection time, simplifies image data handling, and improves defect recognition.

In preferred embodiments, a single inspection tool is configured to perform both a lower resolution fast raster scan, and a higher resolution vector scan plus raster scan. This allows both inspection phases to be performed without moving the wafer from a single substrate stage (e.g., an X-Y stage), and without breaking vacuum. This can result in shorter turnaround time in the factory, and avoid unnecessary handling that can add defects to the wafer by exposing the wafer to particulate contamination during transport to a separate inspection tool.

In preferred embodiments, the inspection tool is configured to perform both the lower and higher resolution scan phases while the wafer is mounted on a single stage. This can avoid positioning errors due to re-alignment and heterogeneous stage matching.

Sharing stage design between electron beam lithography systems and electron beam inspection systems can further reduce alignment errors due to heterogeneous stage matching.

In some embodiments, portions of wafer inspection may occur using electron beam deflection performed in raster scan mode only; or in a combination mode using vector scan and raster scan, with one mode of scanning followed by the other mode.

In some embodiments, a single electron beam column or a cluster of multiple electron beam columns can be used to inspect a wafer using both a fast raster scan phase and a vector scan plus raster scan phase. Parallelizing inspection by using multiple columns can significantly improve throughput; for example, using 100 beam columns can improve throughput by a factor of 100.

Generally, the size of the electron beam column is not important; but columns must be small. For instance, some embodiments may use one or more electron beam columns 100 mm in height and 20 mm in diameter (e.g., some embodiments using electrostatic mini-column architecture).

FIG. 1 schematically shows an example of inspection using a charged particle beam. As shown, a combination of vector scanning and raster scanning is used to inspect features (e.g., contact holes, cut lines and other cut features) in a wafer layer that are identified as requiring inspection.

Once features 2 are identified as requiring inspection, an electron beam vector scans 4 (vectors) to a care-area 6 containing one or more features 2 to be inspected. The electron beam is able to vector scan 4 directly to care-areas 6 because the positions of features 2 are known from the design layout database used to pattern the wafer being inspected.

Once the electron beam is vectored 4 to a care-area 6, the electron beam images the care-area 6 (and thus, the feature (s) 2 in the care-area 6) by raster scanning 8 (rastering) across the care-area 6. In embodiments as shown in FIG. 1, the electron beam is deflected in the same direction along each scan line 8 used to image a care-area 6.

Once a care-area 6 is imaged, the electron beam vectors to the next care-area 6 containing a feature 2 designated for inspection.

Generally, sizes of feature 2 are known, allowing care-areas 6 to be sized for the specific feature 2 being raster scanned 8. The total amount of wafer area imaged, and thus the total time required for inspection, can be significantly reduced by limiting features 2 to be inspected to the areas in the design database (and thus, on the patterned wafer) which are known to be most sensitive to (most likely to contain and/or most damaging if suffering) critical defects. Wafer areas that do not contain care-areas 6 can advantageously be skipped 10 during inspection.

In preferred embodiments, a lower resolution fast raster scan 8 across the patterned wafer (not limited to care-areas) is used to determine which features 2 require inspection. The lower resolution fast raster scan 8 can be used to detect (typically, relatively large) defects, suspected defects, and/or the locations of features 2 to be allocated to care-areas 6 to be imaged using a higher resolution vector scan 4 plus raster scan 8 phase. The vector scan 4 plus raster scan 8 phase can detect smaller defects, and can also be used to categorize defects that were detected during the fast raster scan 8, and to verify defects found as a result of the faster raster scan 8 phase.

Figure 2:
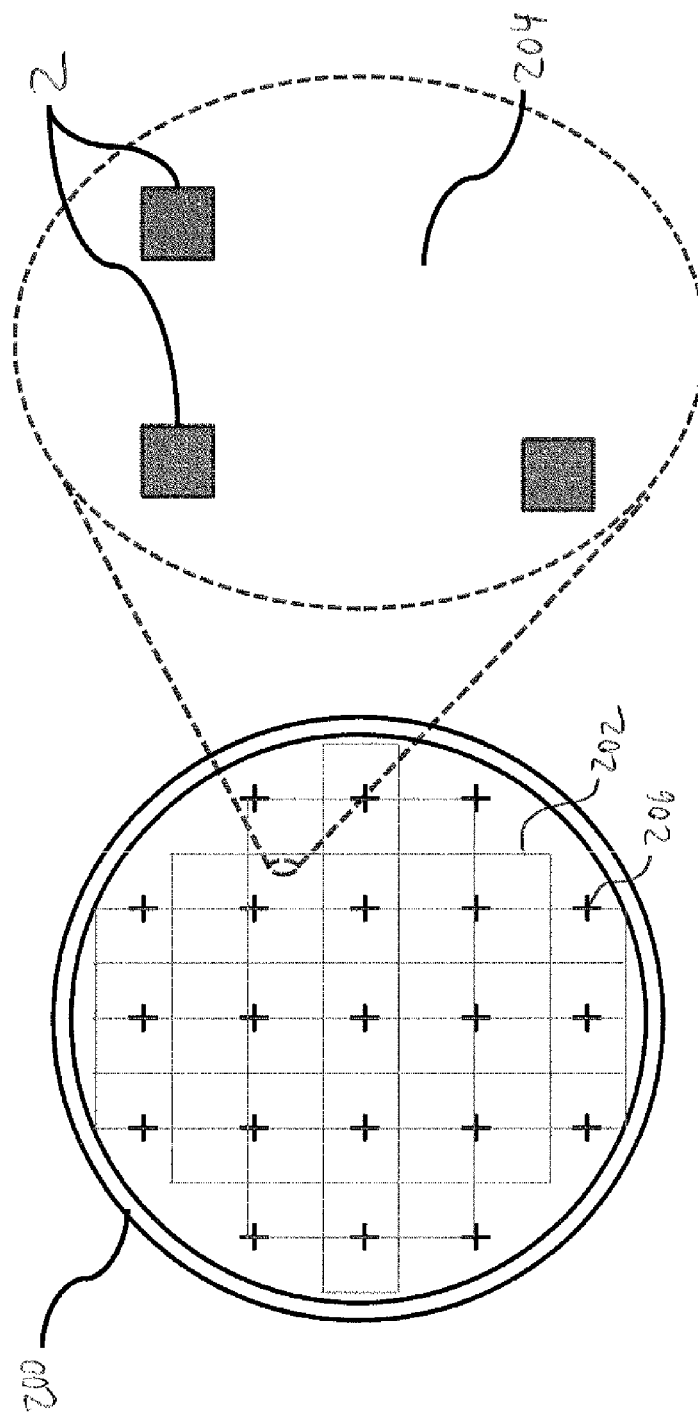
FIG. 2 shows an example of a wafer.

FIG. 2 shows an example of a wafer 200. A wafer 200 generally comprises multiple dies 202, which will be cut from the wafer 200 into separate units later in the manufacturing process (unless the wafer is discarded, e.g., due to too many defects). Typically, over 90% of a patterned die 202 is comprised of unpatterned area 204 and non-critical features 2 that do not require inspection. That is, features 2 that require inspection make up less than 10% of wafer 200 area. A blowup of one location of a die 202 on the wafer 200 shows some patterned features 2, which can be, for example, contact holes.

As shown in FIG. 1, image data is gathered (and beams are emitted) using columns 206 (columns 206 are shown via their center positions, represented here as plusses).

Wafer 200 inspection using electron beams can be made highly parallelized. For example, multiple electron beams can be used to help take advantage of such parallelizability. Electron beams emitted by columns 206 in a multiple column 206 array can be independently and simultaneously scanned across the wafer 200 using electrostatic deflectors (preferably using distributed control systems, see FIG. 5).

Figure 3:
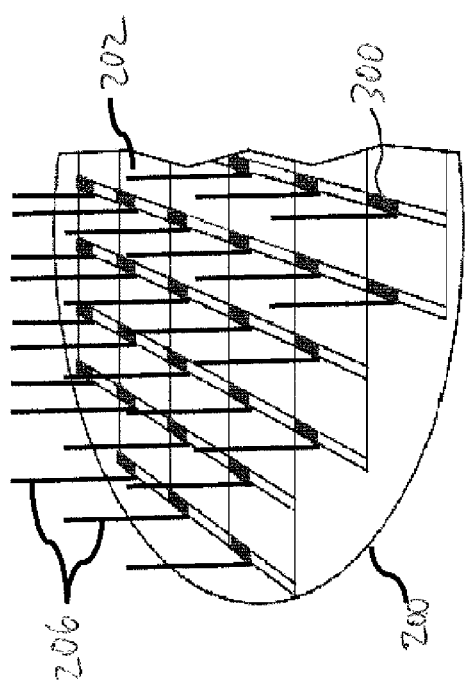
FIG. 3 shows an example of wafer inspection using multiple electron beams.

FIG. 3 shows an example of wafer 200 inspection using multiple electron beams. As shown, the patterned or unpatterned wafer 200 is scanned 300 by multiple columns 206, which emit the electron beams and detect the resulting scattered electrons. In some embodiments, the multiple column 206 array comprises electron beam columns 206 arranged in a regular grid. In preferred embodiments, the array of electron beam columns 206 is stationary, the stage holding the wafer 200 moves back and forth, and the electron beam column 206 moves the beam across the wafer (e.g., vector scanning 4 and raster scanning 8) to perform imaging, during wafer inspection. Preferably, each column 206 has its own detector.

A multiple column 206 array can use a varying number of columns 206. An optimum number of columns 206 will generally be task-dependant, and may result in an array being populated with one column 206, a few columns 206, fully loaded (the maximum number of columns 206 that can be usefully used to inspect a wafer 200), or anything between. For high throughput applications, the multiple column 206 array will typically be fully loaded and capable of imaging the entire patterned surface of the wafer.

Figure 4:
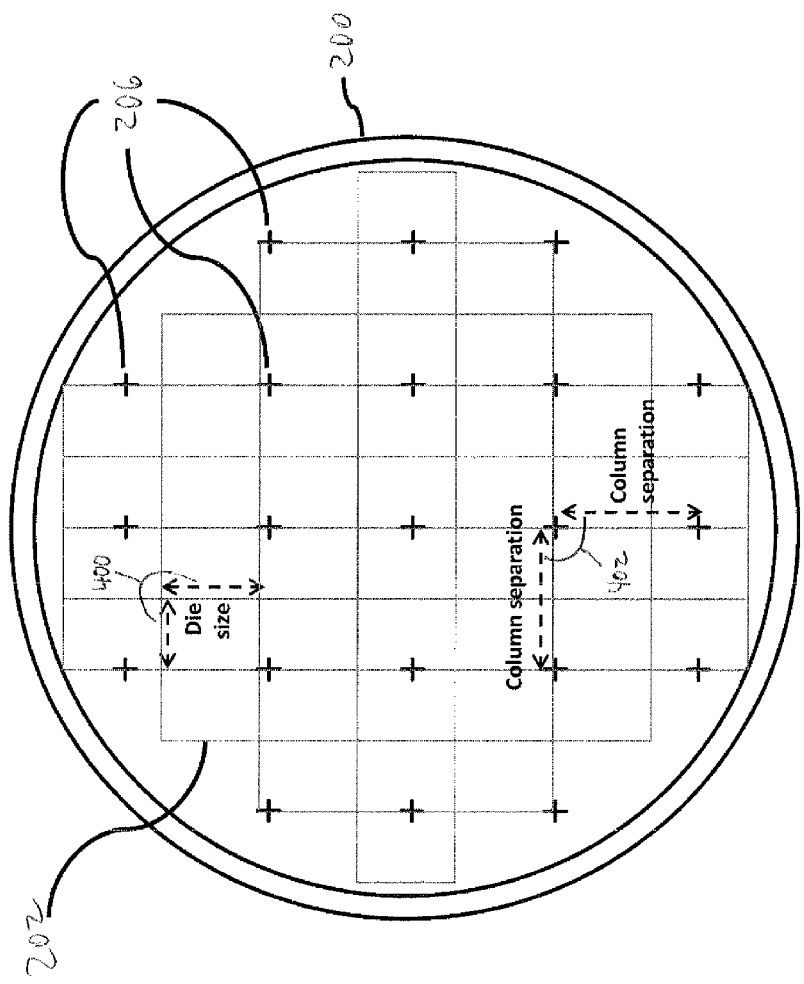
FIG. 4 shows an example of multiple columns imaging a wafer.

FIG. 4 shows an example of multiple columns 206 imaging a wafer 200. A column 206 can be configured to scan a die 202 (IC), part of a die 202, or multiple dies 202 during inspection. Each die 202 may be scanned by one or more columns 206, depending on the column writing area (the area to which the column can deflect its beam to obtain images, taking into account wafer stage movement). Example die 202 size 400 and column 206 center-to-center spacing 402 are shown. A regular grid of columns 206 can use different spacing 402 in different (orthogonal) directions.

Figure 5:
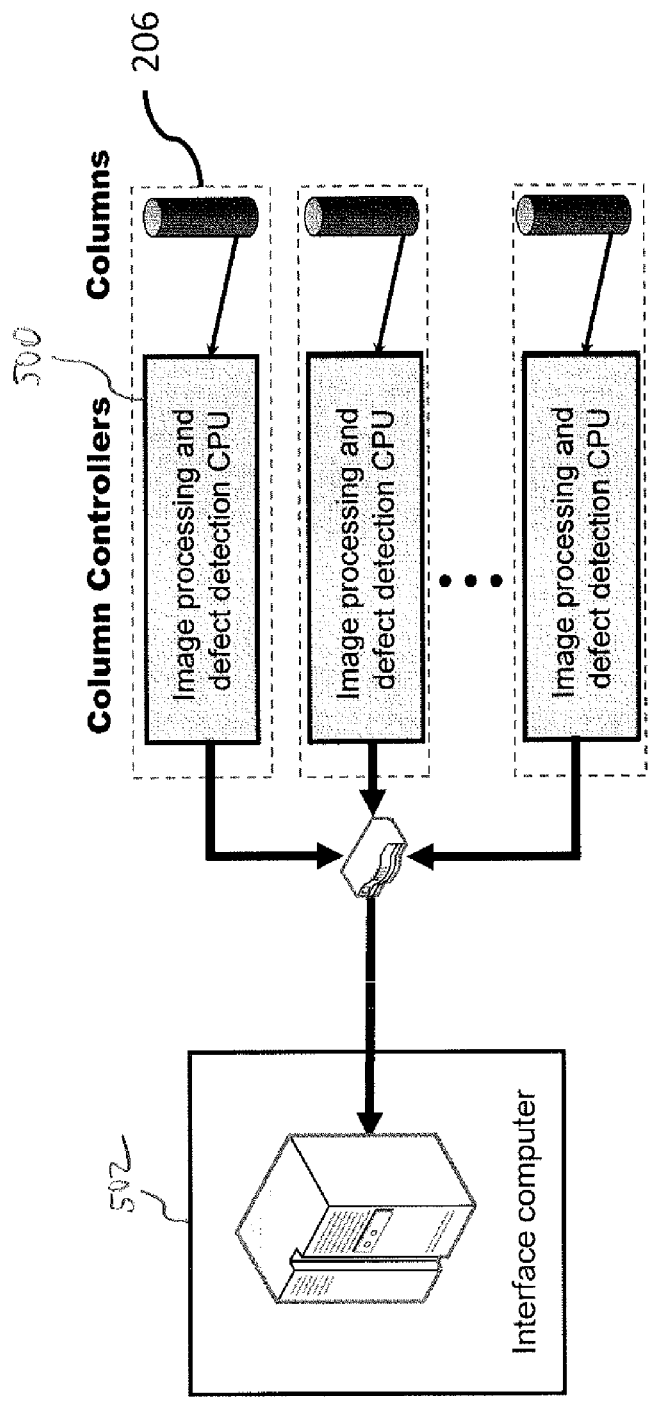
FIG. 5 shows an example of a multiple column inspection system.

FIG. 5 shows an example of a multiple column 206 inspection system. In preferred embodiments, multiple columns 206 are used with multiple column control computers 500 local to the column 206 array—preferably, one control computer 500 local to each column 206. Local column control computers 500 comprise an image processing and defect detection CPU, and a storage medium. The image processing and defect detection CPU compares care-area images obtained by inspection to the design or to known-good images. The storage medium is configured to store, e.g., some or all of a pattern design (preferably a pre-partitioned portion corresponding to the single column 206 controlled by the control computer 500), images for comparison to inspected images (e.g., images of known-good features, or of previous inspection of similar features, or of composite features assembled from multiple previous images, or derived from the design layout template) corresponding to the design, and inspection data.

An interface computer 502 receives and collates raw and/or processed defect data from local control computers 500, and can be used to coordinate the local column control computers 500. For example, the interface computer 502 can perform defect categorization, and can control which features 2 are to be re-scanned by a higher resolution defect review (i.e., a vector scan 4 plus raster scan 8 inspection phase).

During an inspection by a multiple column inspection system, a particular column 206 will only be able to inspect a particular portion of the wafer 200—generally, no more than the wafer 200 area the column 206 can deflect its beam to and effectively image, taking into account stage motion. The lithography design can be partitioned among the various local column control computers 500. Advantageously, a local computer 500 corresponding to a column 206 will only store that "pre-partitioned" portion of the design corresponding to the particular wafer 200 area that can be inspected by that column 206. Preferably, local control computers 500 only analyze their respective portions of the design, and local computers 500 are not required to transmit full wafer images. This enhances defect analysis parallelization.

The design layout template can be pre-partitioned among local control computers 500, so that each local control computer 500 only stores known-good feature images for features 2 that can be found within the local computer's 500 pre-partitioned portion of the design. This can significantly reduce the size of the feature image database (for comparison to inspection images) that individual local computers 500 are required to store.

Local control computers 500 can significantly reduce required defect data bandwidth requirements (and broadly, data path requirements), e.g., from local computers 500 to an interface computer 502. Local control computers 500 can perform defect detection and other image processing prior to transmission to an interface computer 502; and pre-partitioning means that local control computers 500 only need to transmit their respective image portions, and/or defect and/or image data relevant to those respective image portions.

Local control computers 500 can also reduce data processing time. Dedicating a local computer 500 to a column 206 means the column 206 can acquire images while the local computer 500 compares the images with other images or with design data, and/or classifies defects to be inspected. In some embodiments, the image size per contact hole feature 2 can be limited to just a few pixels, enabling quick image comparison for defect recognition in the local column controller 500.

Each column controller 500 can compile a small database of defects. In some embodiments, a small (memory footprint) defect database can be used, because care-areas 6, once designated, are in known locations; care-area 6 image sizes (memory footprint and in number of pixels) can be limited depending on known feature 2 sizes; and defect image sizes are generally small.

Local control computers 500 can communicate with the interface computer 502 using a network 504. In some embodiments, a gigabit network is adequate to effect defect data transfer (including, e.g., defect database transfer).

Defect analysis and classification can generally be performed quickly in embodiments where each wafer 200 layer includes only a few feature 2 shapes; this correlates strongly with the variety of defect image types being limited. Quick defect classification enables fast re-scan of selected defects (e.g., the worst and/or most problematic and/or most likely defects) at a high resolution.

Figure 6A:
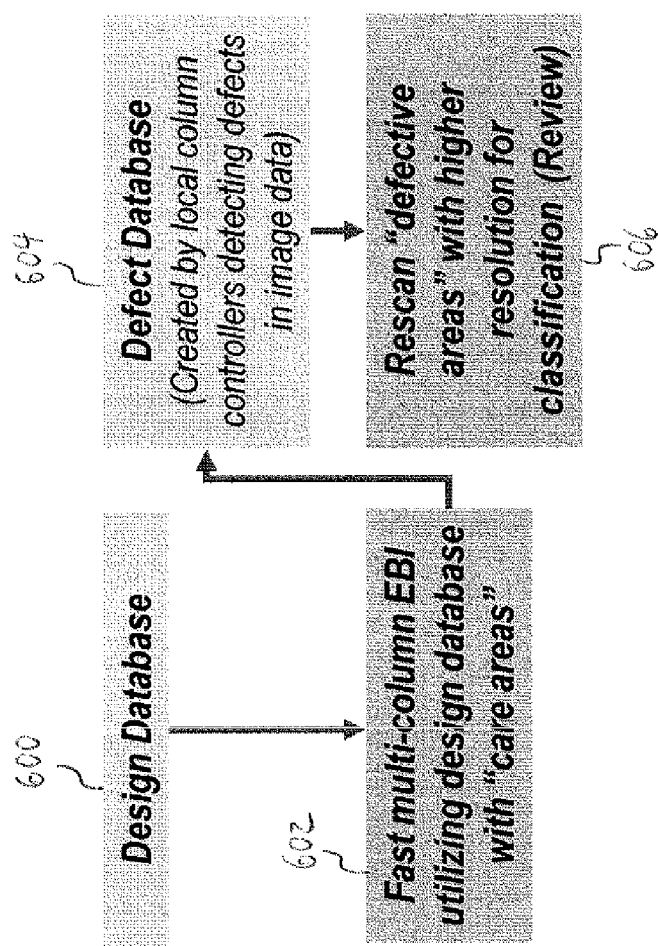
FIG. 6A shows an example of a wafer inspection process.

FIG. 6A shows an example of a wafer inspection process. A design database 600 corresponding to the wafer 200 to be inspected is used to by an inspection tool, which performs a fast raster scan 8 of the patterned wafer 200 to obtain an image 602 of the wafer 200. A defect database 604 is then created specifying actual or potential defects or other critical areas, to be designated as care-areas 6 to be reviewed in finer detail, as found using the wafer 200 imaging 602. The wafer 200 is then rescanned, by vectoring 4 the beam to care-areas 6, and raster scanning 8 the care areas at higher magnification 606 (than used for the initial imaging step 602).

Figure 6B:
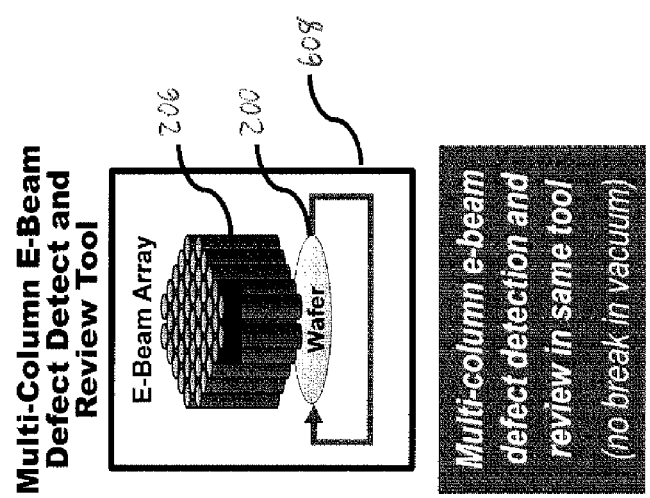
FIG. 6B schematically shows an example of wafer inspection.

FIG. 6B schematically shows an example of wafer inspection. In preferred embodiments, an inspection tool has the capability to perform both defect detection (a fast low resolution raster scan 8 phase to identify care-areas 6) and review (a high resolution vector scan 4 plus raster scan 8 phase reviewing care-areas 6), to avoid breaking vacuum (which avoids adding particulate contamination and other handling-related defects); and to exploit not having to move the wafer 200 from a single stage, reducing alignment issues; and to exploit homogeneity (identity!) of inspection tool parts, avoiding alignment and other issues stemming from inspection tool part heterogeneity; and to shorten turnaround time (and improve throughput) in the factory.

Figure 6C:
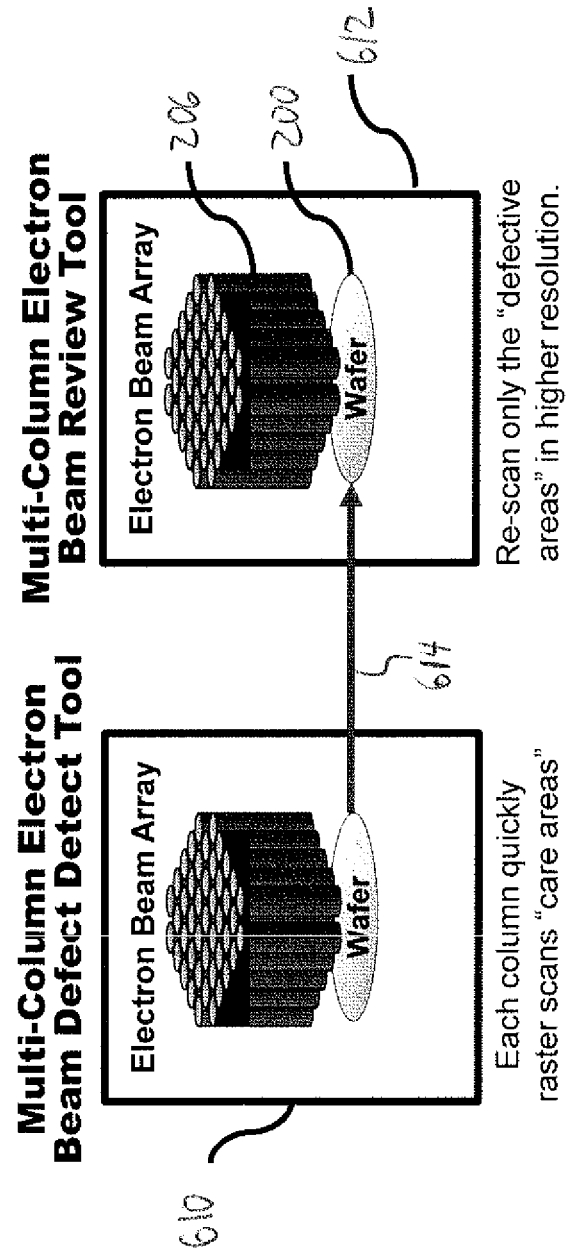
FIG. 6C schematically shows an example of wafer inspection.

FIG. 6C schematically shows an example of wafer inspection. In some (less preferred) embodiments, the fast raster scan 8 inspection phase and the vector scan 4 plus raster scan 8 inspection phase are performed in separate inspection tools (e.g., that do not share vacuum space or wafer stage)—a multiple column electron beam defect detection tool 610 (performing the fast raster scan 8 inspection phase), and a multiple column electron beam defect review tool 612 (performing the vector scan 4 plus raster scan 8 inspection phase). This results in having to transfer the wafer 200 from one tool to the other 614, leading to an increased chance of particulate contamination, and loses significant beam alignment and other advantages by requiring handling and realignment, and potentially introducing a degree of inspection tool part heterogeneity.

Figure 7A:
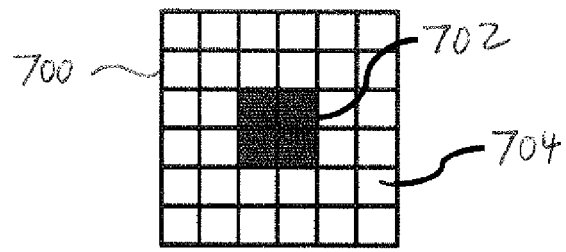
FIG. 7A shows an example of an inspection image of a feature.

FIG. 7A shows an example of an inspection image of a feature 2. If there are only a few different sizes of features 2 in a given layer (e.g. contact holes), the raster scan can be sized for only a few different sizes of features 2. Based on the known size of the feature 2, the electron beam raster scans 8 a minimal area (care-area 6) to produce a pixel image 700. The raster scan 8 area (care-area 6) can be optimized for throughput while meeting required defect sensitivity. The feature image 702 may consist of only a few pixels 704 in the pixel image 700. Using known and uniform feature shapes (e.g. contact holes) and known locations helps to minimize raster scan area in electron beam inspection.

FIG. 7A shows a centered imaged feature 702, e.g., a contact hole. Since the feature image 702 is only a few pixels, the database size of the image 700 can be small.

Figure 7B:
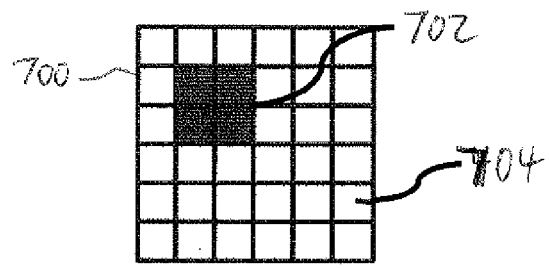
FIG. 7B shows an example of an inspection image of a feature.

FIG. 7B shows an example of an inspection image of a feature 2. FIG. 7B shows an offset imaged feature 702, e.g., a contact hole.

Figure 7C:
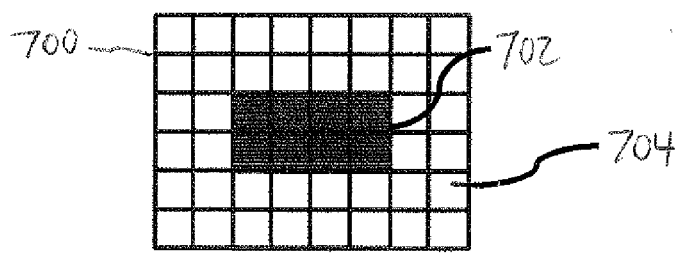
FIG. 7C shows an example of an inspection image of a feature.

FIG. 7C shows an example of an inspection image of a feature 2. FIG. 7C shows a centered, slightly larger (by number of pixels) imaged feature 702 than FIGS. 7A and 7B, e.g., a double contact hole.

Figure 8:
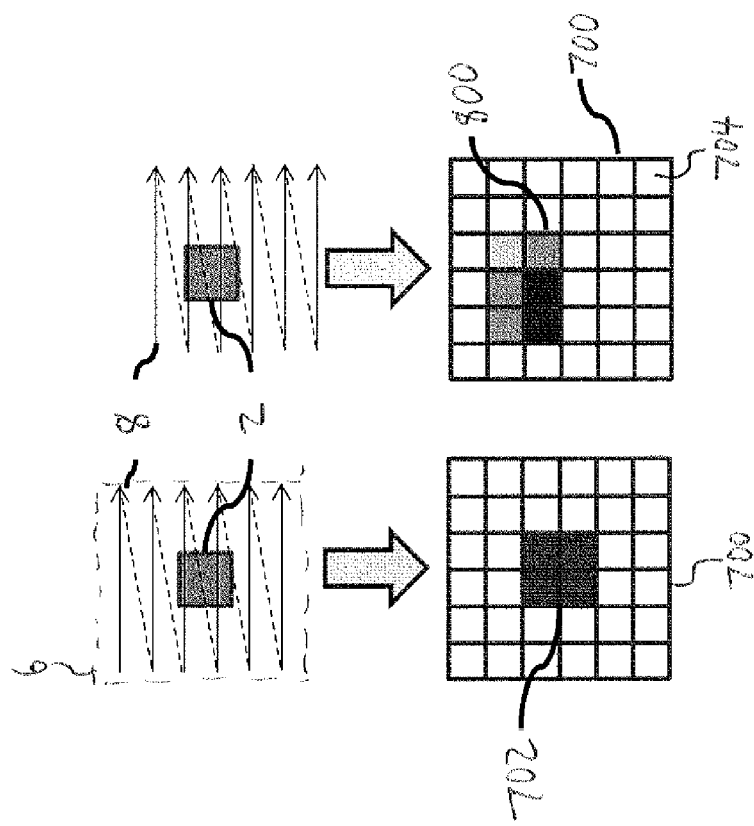
FIG. 8 shows an example of inspection images of features.

FIG. 8 shows an example of inspection images of features 2. If features 2 are the same size and shape, each feature image 702 is nominally identical to the images of others. The image data is very simple, with the exception of minor displacements—e.g., a feature image not lining up perfectly to pixels 800, resulting in grayscale pixels 704—which can be compensated for (e.g., by computation by a local column control computer 500).

The small scan area of a care-area 6 results in small image data size, and therefore small image database size. Since the image database is small, and wafer 200 area not containing care-areas 6 is skipped 10, image processing time is faster. If the feature 2 is offset within the raster scan area 800, its edges may fall in the middle of a pixel 704. The image of the offset feature 800 may consist of multiple shades of grey, depending on where the edge of the feature 2 falls within each pixel 704. In this case the image processing CPU can interpret the grey-scale image 800 to approximate the location of the edge of the feature 2 and to determine the feature offset within the raster scan 8 area (the care-area 6).

Use of known and uniform feature 2 shapes (e.g. contact holes) and known feature 2 locations assist in minimizing image data size, and therefore image database size and image processing time in multiple column 206 electron beam inspection.

Figure 9:
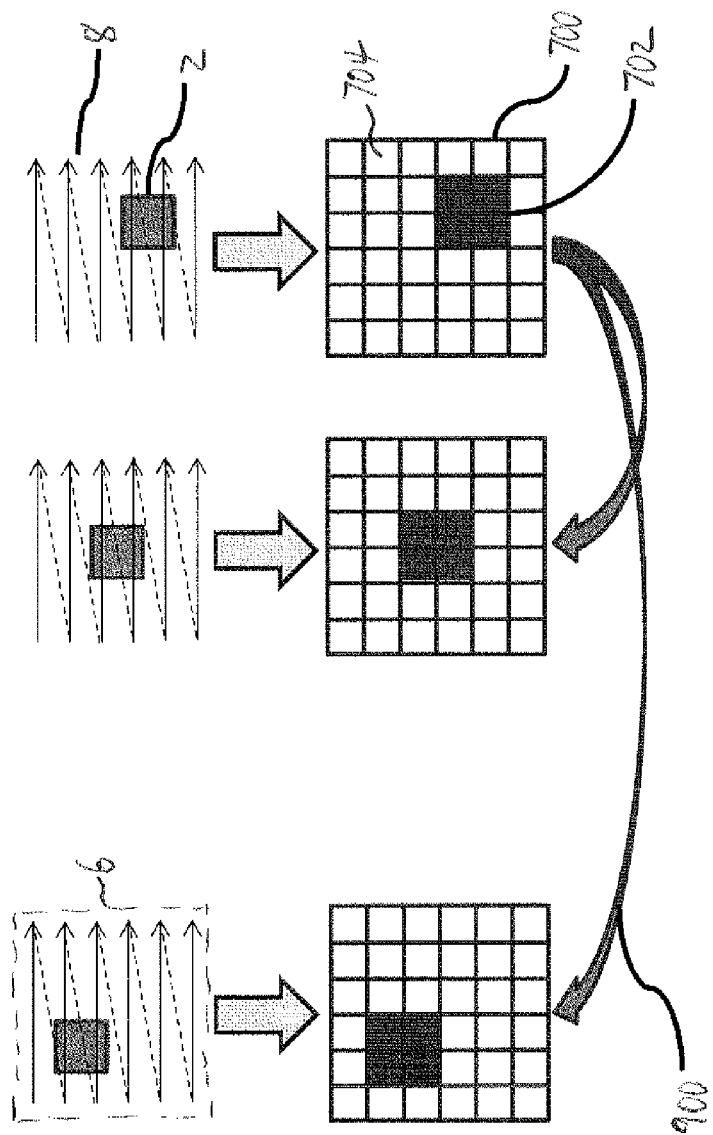
FIG. 9 shows an example of defect recognition of similar features.

FIG. 9 shows an example of defect recognition of similar features 2. If features 2 (e.g. contact holes) are in a few sizes only, it is possible to program the raster scan 8 to fit each size (i.e., to size the care-area minimally), and then recognize the defective features 2 by comparing 900 the new feature image 702 with previous feature images 702 (here and elsewhere, comparisons can be or include comparisons of full care-area 6 images 700). This allows quick comparison, and defect recognition, by comparing a new image with the previous two images 900.

Figure 10:
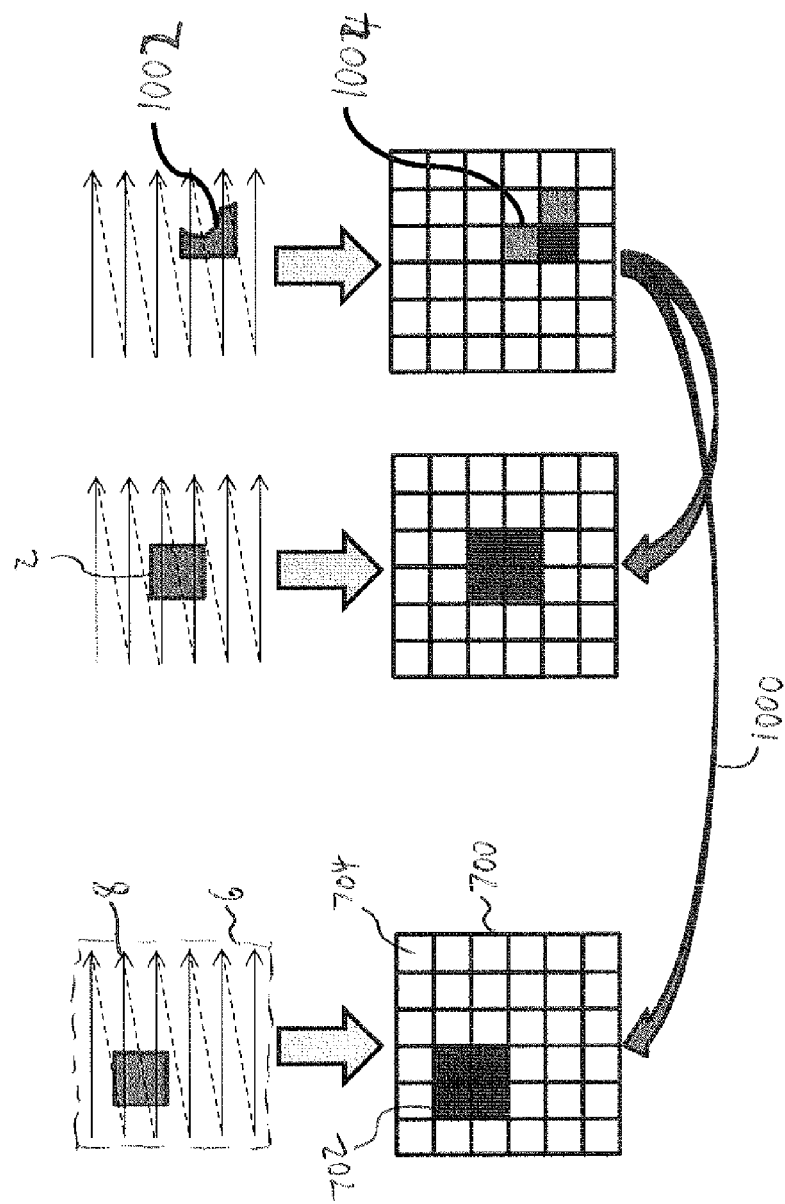
FIG. 10 shows an example of defect detection.

FIG. 10 shows an example of defect detection. A defect 1002 can be detected by comparing 1000 a (new) defective feature image 1004 (an image of a feature 2 with a "mouse bite" defect 1002) with the previous two (or more) feature images 702 using a "vote" method—if the two previous feature images 702 do not match the new feature image 1004, the new feature image 1004 is flagged as defective. The defect can be categorized later, e.g., by an interface computer 502.

Figure 11:
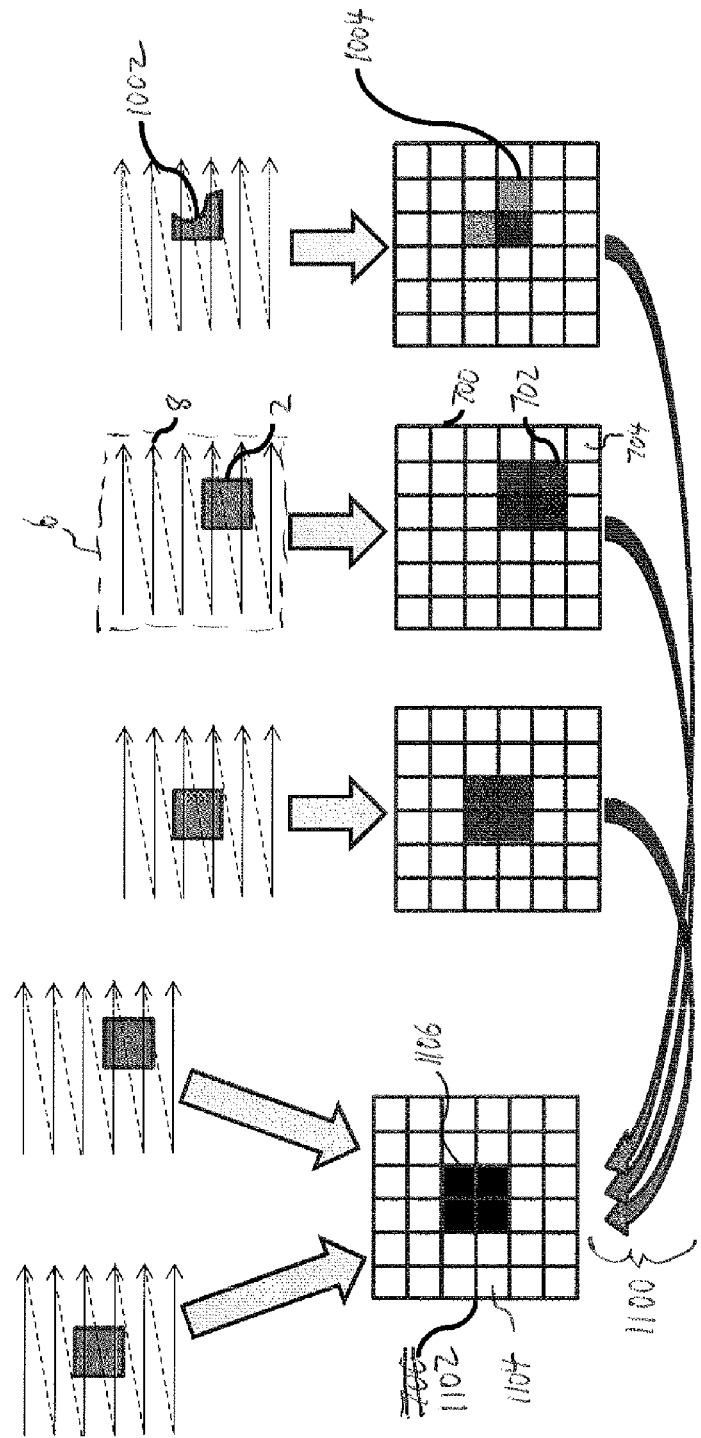
FIG. 11 shows an example of defect detection.

FIG. 11 shows an example of defect detection. Defective features 1002 can be recognized by comparing 1100 the (new) defective feature image 1004 with a known-good composite (or average) image 1106 or with "pre-partitioned" design layout data (or template from database of sample features including "ideal" features and/or defective features). (Or comparison 1100 to the full care-area-sized known-good composite image 1102.)

Figure 12A:
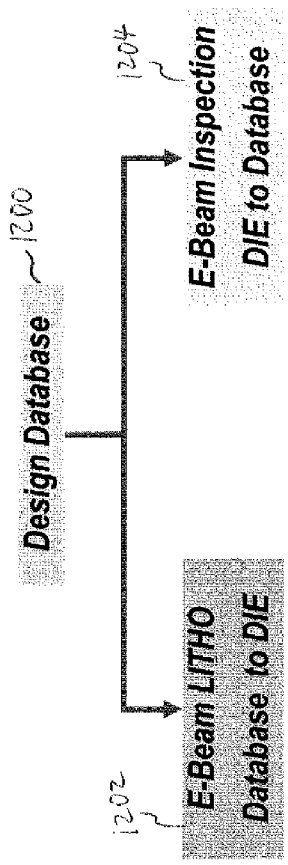
FIG. 12A shows an example of information flow in a substrate writing and inspection process.

FIG. 12A shows an example of information flow in a writing and inspection process. A design database 1200 is used by an electron beam lithography tool, which writes the pattern specified by the design database 1200 to a wafer 1202. The design database 1200 is also used by an electron beam inspection tool, which compares a wafer to the pattern specified by the design database 1200 to find defects 1204.

Figure 12B:
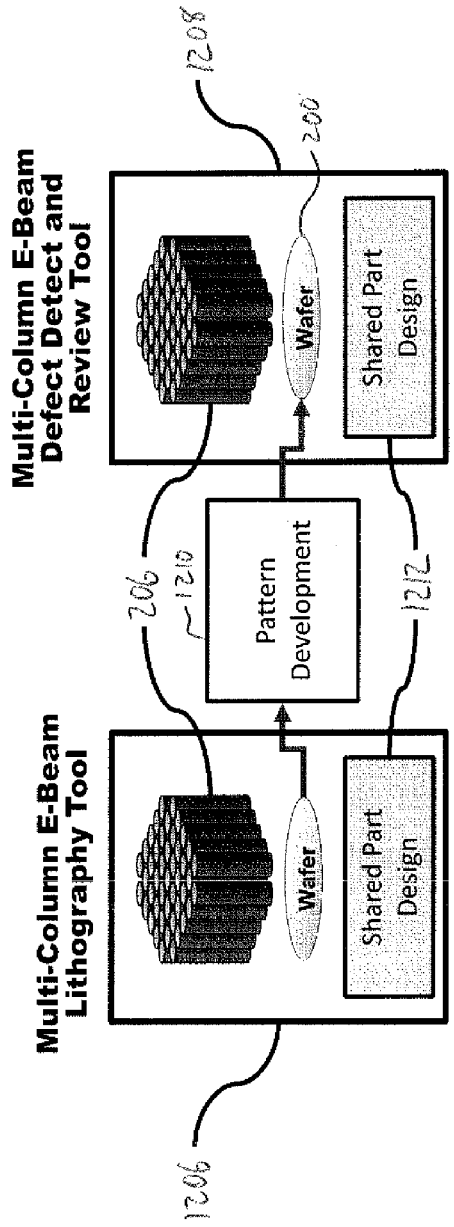
FIG. 12B schematically shows an example of substrate writing, pattern development and inspection.

FIG. 12B schematically shows an example of substrate writing, pattern development and inspection. Combined raster scanning 4 and vector scanning 8 inspection can be used to enable rapid qualification and monitoring of an electron beam lithography tool 1206 that shares part design with an electron beam inspection tool 1208. When a lithography tool 1206 is found by an inspection tool 1208 to have produced one or more wafers 200 (depending on, e.g., qualification requirements, number or types of defects detected, or other inspection history properties) that meet a specified benchmark level of defects, the lithography tool 1206 can be considered qualified for in-line wafer fabrication. If a lithography tool 1206 being used for in-line wafer fabrication is found by the inspection tool 1208 to produced one or more wafers 200 that rise above a specified (possibly different) benchmark level of defects, the lithography tool 1206 can be de-qualified (removed) from in-line wafer fabrication until the reason(s) for the excess defects is found.

A multiple column 206 electron beam lithography tool 1206 can be used to pattern a wafer 200. After the pattern development 1210, the wafer 200 is passed to a multiple column 206 electron beam inspection tool 1208 to be inspected. In embodiments as shown in FIG. 12B, the lithography tool 1206 and inspection tool 1208 share part design—such as of the column 206 array (the columns 206 individually and/or as an array configuration), wafer stage, design layout database, and column control computers 500 (hardware and/or software). By sharing part design, beam alignment can be more easily and/or closely matched (e.g., not having to contend with heterogeneous stage or deflector design) between the lithography tool 1206 and the inspection tool 1208, allowing faster and more accurate beam alignment calibration and/or wafer inspection by the inspection tool 1208.

Shared part design can also assist in determination by the inspection tool 1208 that the lithography tool 1206 is (or is not) causing certain types of defects during writing as a result of particular problems in the lithography tool 1206.

Figure 12C:
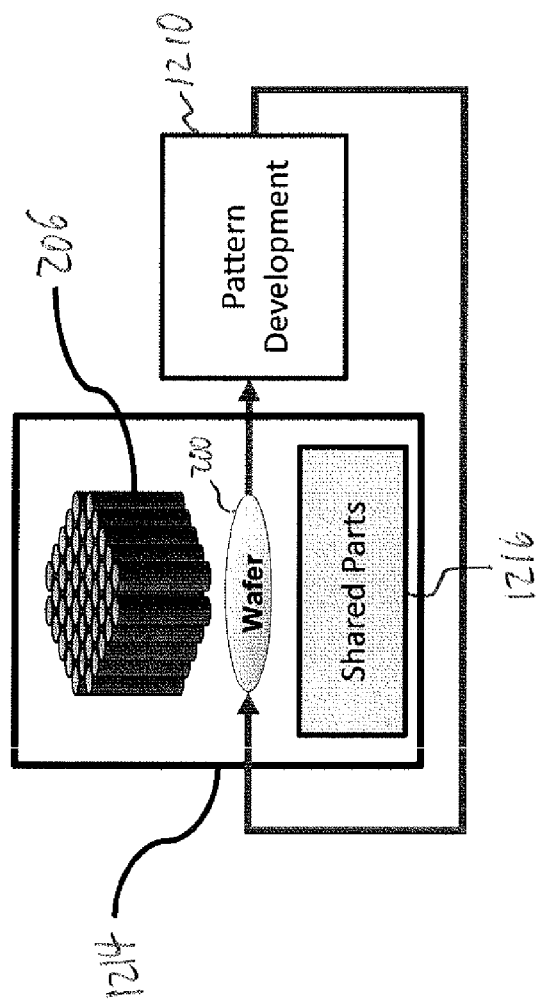
FIG. 12C schematically shows an example of substrate writing, pattern development and inspection.

FIG. 12C schematically shows an example of substrate writing, pattern development and inspection. Combined raster scanning 4 and vector scanning 8 inspection can be used to enable rapid qualification and monitoring of an e-beam lithography tool 1214 that is also capable of e-beam inspection 1216. Identical parts match even better than the shared parts discussed with respect to embodiments as shown in FIG. 12B; and shared vacuum space means a reduced chance of defects from particulate contamination.

Figure 13:
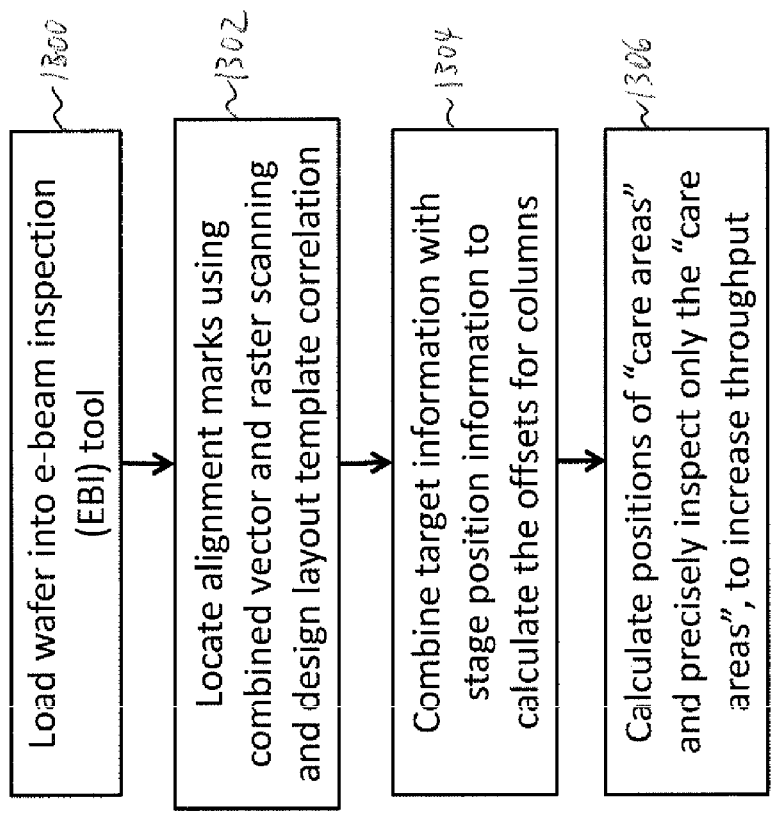
FIG. 13 shows an example of a column alignment process.

FIG. 13 shows an example of a column alignment process. Combined vector scanning 4 and raster scanning 8 can be used to obtain image data to improve beam placement accuracy in electron beam inspection. In preferred embodiments, multiple columns 206 are used with multiple local column control computers 500 to enable distributed pattern recognition target acquisition to improve beam registration (correspondence of beam alignment to wafer position).

The wafer is loaded into an electron beam inspection (EBI) tool 1300. Electron beams used for lithography then locate alignment marks, based on expected location provided by the design layout template. The beam is vectored 4 to a fiducial mark, and rastered 8 to image the fiducial mark. The fiducial mark images are then compared to the design layout template to determine the precise actual positioning of the beam on the wafer surface 1302. This determination takes into account where the beam actually imaged, versus where the beam was instructed to image (using pattern recognition and design layout template correlation). The positioning determination 1302 is then combined with precise stage position information (e.g., from laser interferometry data) to calculate offsets to be used with respect to the columns 206 to correctly position corresponding beams 1304. Using the calculated offsets, the electron beams can be deflected onto the wafer 200 surface with high accuracy, improving accuracy in precisely locating and imaging care-areas 1306, thus improving inspection throughput.

Figure 14A:
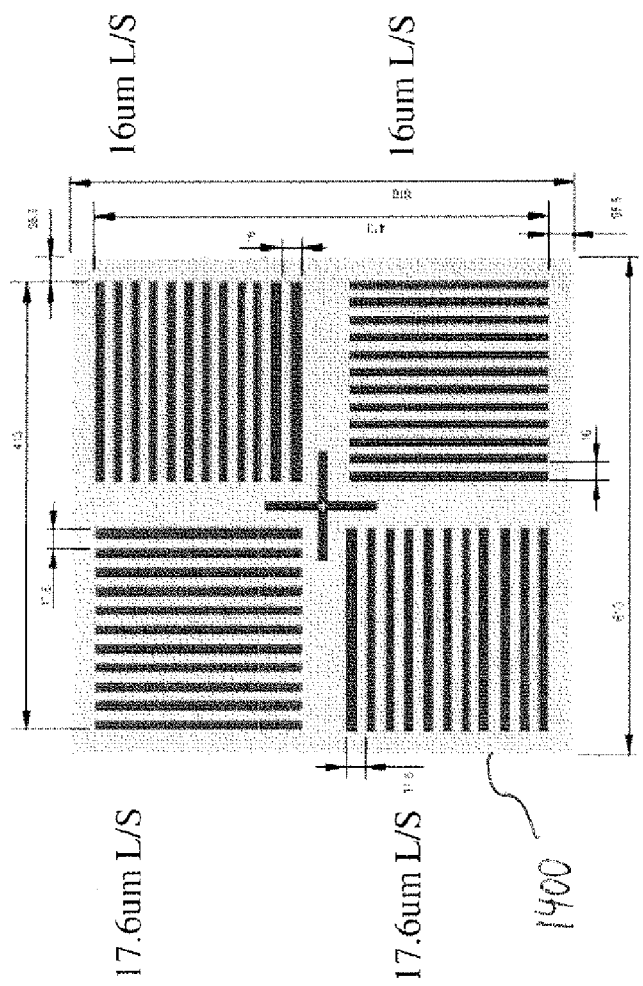
FIG. 14A shows an example of a wafer alignment mark.
Figure 14B:
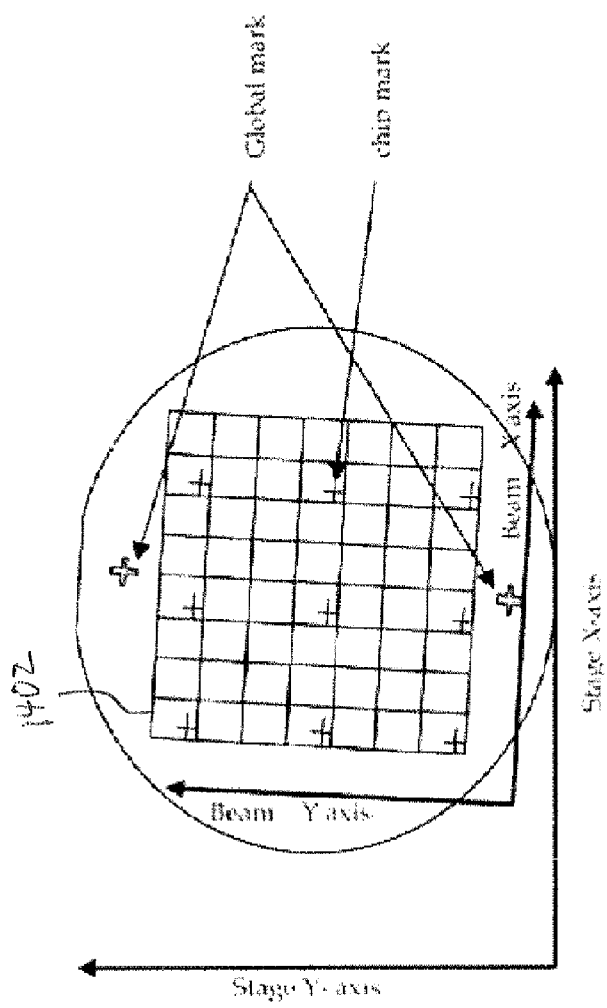
FIG. 14B shows an example of a wafer alignment mark.

FIGS. 14A and 14B show examples of wafer alignment marks. Wafer alignment marks are also called fiducial marks, and are known to allow precise positioning at various points in the wafer manufacturing process by providing common measureable points of reference.

Alignment marks can be designed for easy pattern recognition. When an alignment mark is raster scanned to obtain an image, the alignment mark can be identified within the image by using pattern recognition. For instance, portions of the image can be compared to a template until a strong correlation is found.

Imaging fiducial markings on the wafer with a combination of vector 4 and raster scanning 8, enables fast wafer-alignment calibration in inspection; and enables applications to lithography that can improve pattern-limited yield by improving beam alignment.

Charged particle beam alignment can be performed by vectoring 4 the beam to a substrate region with alignment marks; rastering 8 the beam across the region to detect actual mark positions relative to beam calibration; and then correlating results for one or more regions with stage position information to determine beam column offsets to more precisely calibrate beam positioning.

Figure 15:
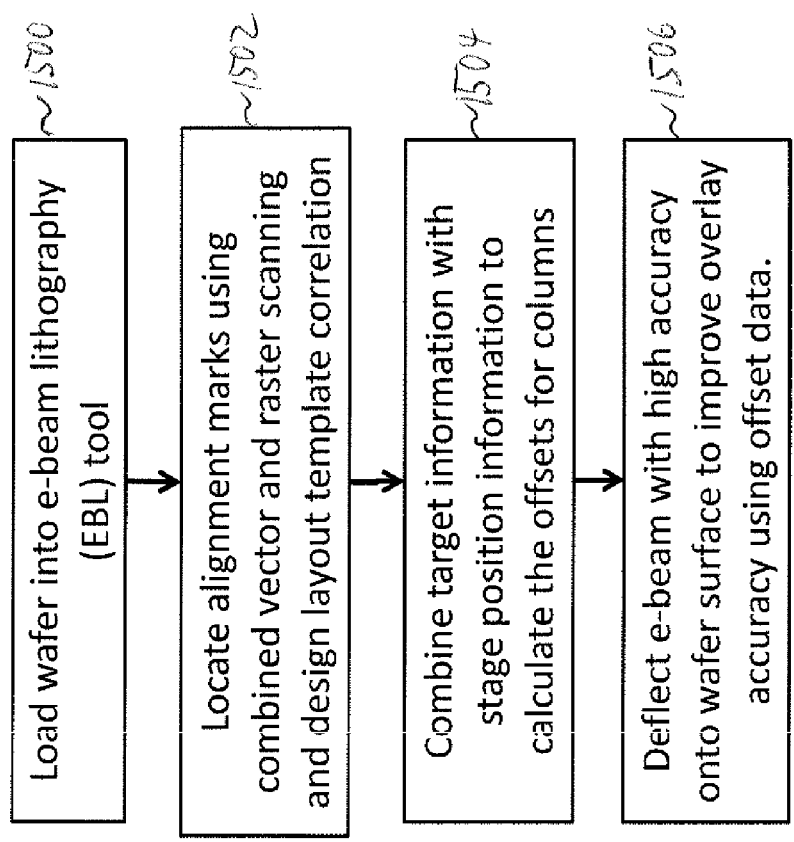
FIG. 15 shows an example of a wafer alignment process.

FIG. 15 shows an example of a wafer alignment process. Combined vector scanning 4 and raster scanning 8 can be used to obtain image data to improve beam placement accuracy in electron beam lithography, improving accuracy of the pattern placement as well as layer-to-layer accuracy (or overlay accuracy), in which features in the layer in process must align precisely with features in the layer(s) underneath. Beam placement accuracy and overlay accuracy are known to correlate positively with device yield.

The wafer is loaded into an electron beam lithography (EBL) tool 1500. Electron beams (generally, the same beams used for lithography, at sub-writing power) then locate alignment marks, based on expected location provided by the design layout template. The beam is vectored 4 to a fiducial mark, and rastered 8 to image the fiducial mark. The fiducial mark images are then compared to the design layout template to determine the precise actual positioning of the beam on the wafer surface 1502. This determination takes into account where the beam actually imaged, versus where the beam was instructed to image (using pattern recognition and design layout template correlation). The positioning determination 1502 is then combined with precise stage position information (e.g., from laser interferometry data) to calculate offsets to be used with respect to the columns 206 to correctly position corresponding beams 1504. Using the calculated offsets, the electron beams can be deflected onto the wafer 200 surface with high accuracy, improving overlay accuracy 1506.

Figure 16:
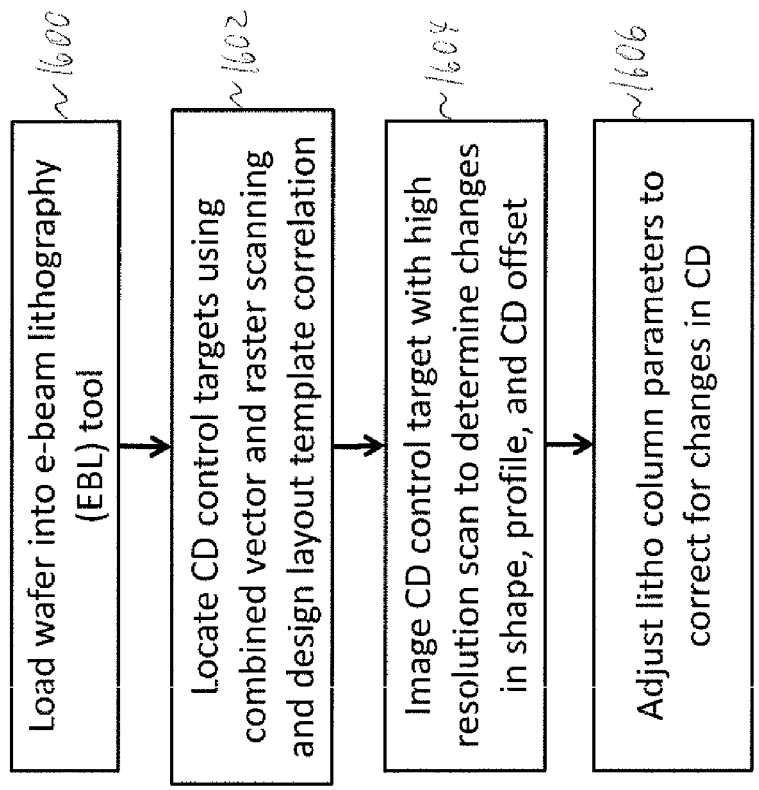
FIG. 16 shows an example of a critical dimension control process.

FIG. 16 shows an example of a critical dimension control process. Combined vector scanning and raster scanning 8 can be used to obtain image data to improve Critical Dimension (CD) control in electron beam lithography. The critical dimension is the minimum feature size specified by the design layout template. Critical dimension control attempts to calibrate beams to more precisely write critical dimension features (which can also improve general writing precision). Improvements in critical dimension control are known to correlate positively with device yield.

The wafer is loaded into an electron beam lithography (EBL) tool 1600. Electron beams used for lithography then locate critical dimension control targets, based on expected location provided by the design layout template. The beam is vectored 4 to a critical dimension control target (a specified critical dimension feature, which can written for the purpose), and rastered 8 to image the critical dimension control target 1602. The critical dimension control target images are then compared to the design layout template to determine differences in shape, profile, and critical dimension offset between the critical dimension control target image and the critical dimension control target as specified by the design layout template, and to calculate adjustments to writing parameters to correct for such differences 1604. The calculated writing adjustments are then used to adjust lithography and to write with improved critical dimension control 1606.

Generally, the design layout template includes information for writing the substrate, including the writing pattern, critical dimension control target information, and alignment mark (fiducial mark) information.

According to some but not necessarily all embodiments, there is provided: A method for inspecting a substrate using multiple charged particle beams produced by multiple columns, comprising the actions of: a) imaging the substrate at a low resolution using scanning of the beams in a predefined regular pattern across the substrate, different ones of the beams targeting different corresponding portions of the substrate; b) identifying one or more care-areas on the substrate using said low resolution imaging; c) vectoring ones of the beams to corresponding ones of said care-areas within said corresponding portions without using said predefined regular pattern; and d) imaging the substrate at a high resolution using scanning of the vectored beams in a raster-like pattern across said corresponding care-areas, while substantially skipping non-care-areas, wherein steps c) and d) are performed differently and simultaneously by different ones of the beams.

According to some but not necessarily all embodiments, there is provided: A method for writing and/or inspecting a substrate using multiple charged particle beams produced by multiple columns, comprising: a) vectoring ones of the beams to corresponding ones of multiple fiducial marks on the substrate, different ones of the beams targeting different corresponding portions of the substrate, said corresponding fiducial marks being within said corresponding portions; b) imaging using scanning of the vectored beams in a raster-like pattern across said corresponding fiducial marks while substantially skipping other substrate areas; d) calculating offsets for respective different ones of the beams in at least partial dependence on said imaging and on a position of a stage; and e) writing and/or inspecting the substrate using said calculated offsets to position the beams, wherein steps a) and b) are performed differently and simultaneously by different ones of the beams.

According to some but not necessarily all embodiments, there is provided: A method of qualifying a substrate writing tool for in-line fabrication using inspection of at least one substrate using multiple charged particle beams produced by multiple columns, comprising the actions of: a) vectoring ones of the beams to corresponding ones of multiple care-areas on the substrate, different ones of the beams targeting different corresponding portions of the substrate, said corresponding care-areas being within said corresponding portions; and b) imaging the substrate using scanning of the vectored beams in a raster-like pattern across said corresponding care-areas, while substantially skipping non-care-areas, wherein steps a) and b) are performed differently and simultaneously by different ones of the beams, wherein steps a) and b) are performed by an inspection tool using substantially the same designs as the substrate writing tool for at least one of a substrate-mounting stage, said columns, and one or more column controllers, and wherein whether the substrate writing tool is qualified for in-line fabrication is at least partially determined by the number and types of feature defects found using step b).

According to some but not necessarily all embodiments, there is provided: A method for inspecting a substrate using multiple charged particle beams produced by multiple columns, comprising the actions of: a) vectoring ones of the beams to corresponding ones of multiple care-areas on the substrate, different ones of the beams targeting different corresponding portions of the substrate, said corresponding care-areas being within said corresponding portions; and b) imaging the substrate using scanning of the vectored beams in a raster-like pattern across said corresponding care-areas, while substantially skipping non-care-areas, wherein steps a) and b) are performed differently and simultaneously by different ones of the beams.

According to some but not necessarily all embodiments, there is provided: A method for writing a substrate using multiple charged particle beams produced by multiple columns, comprising, comprising: a) vectoring ones of the beams to corresponding ones of multiple critical dimension control targets on the substrate, different ones of the beams targeting different corresponding portions of the substrate, said corresponding critical dimension control targets being within said corresponding portions; b) imaging using scanning of the vectored beams in a raster-like pattern across said corresponding critical dimension control targets while substantially skipping other substrate areas; d) calculating adjustments to beam writing parameters, in at least partial dependence on said imaging, to write critical dimension features with better fidelity to a corresponding design layout template; and e) writing the substrate using said calculated adjustments, wherein steps a) and b) are performed differently and simultaneously by different ones of the beams.

According to some but not necessarily all embodiments, there is provided: A substrate inspection tool, comprising: multiple charged particle beam columns, ones of said columns being configured to produce a charged particle beam, different ones of said beams targeting different corresponding portions of the substrate; one or more beam controllers configured to: receive inspection data from said columns, control said columns to image the substrate at a low resolution using scanning of said beams in a predefined regular pattern across the substrate, identify one or more care-areas on the substrate in at least partial dependence on inspection data from said scanning, vector ones of said beams to corresponding ones of said care-areas within said corresponding portions without using said predefined regular pattern, and image the substrate at a higher resolution using scanning of said vectored beams in a raster-like pattern across said corresponding care-areas, while substantially skipping non-care-areas, wherein different ones of said beam controllers differently and simultaneously control different ones of said beams to perform said vectoring and said high resolution imaging.

According to some but not necessarily all embodiments, there is provided: A substrate inspection tool, comprising: multiple charged particle beam columns, ones of said columns being configured to produce a charged particle beam, different ones of said beams targeting different corresponding portions of the substrate; one or more beam controllers configured to: vector ones of said beams to corresponding ones of multiple care-areas within said corresponding portions, and image the substrate using scanning of said vectored beams in a raster-like pattern across said corresponding care-areas, while substantially skipping non-care-areas, wherein different ones of said beam controllers differently and simultaneously control different ones of said beams to perform said vectoring and said high resolution imaging.

According to some but not necessarily all embodiments, there is provided: A tool for writing and/or inspecting a substrate, comprising: multiple charged particle beam columns, ones of said columns being configured to produce a charged particle beam and to write and/or inspect the substrate using calculated offsets to position said beams, different ones of said beams targeting different corresponding portions of the substrate; one or more beam controllers configured to: vector ones of said beams to corresponding ones of multiple fiducial marks within said corresponding portions, image the substrate using scanning of said vectored beams in a raster-like pattern across said corresponding fiducial marks, while substantially skipping other substrate areas, and calculate said offsets for respective ones of said beams in at least partial dependence on said imaging and on a position of a stage; wherein different ones of said beam controllers differently and simultaneously control different ones of said beams to perform said vectoring and said high resolution imaging.

According to some but not necessarily all embodiments, there is provided: A substrate inspection tool for qualifying a substrate writing tool for in-line fabrication: multiple charged particle beam columns, ones of said columns being configured to produce a charged particle beam, different ones of said beams targeting different corresponding portions of the substrate; one or more beam controllers configured to: vector ones of said beams to corresponding ones of multiple care-areas within said corresponding portions, and image the substrate using scanning of said vectored beams in a raster-like pattern across said corresponding care-areas, while substantially skipping non-care-areas, at least one of a stage, said charged particle beam columns, and said column controllers, manufactured using substantially the same design as corresponding portions of the substrate writing tool, wherein different ones of said beam controllers differently and simultaneously control different ones of said beams to perform said vectoring and said high resolution imaging, and wherein whether the substrate writing tool is qualified for in-line fabrication is at least partially determined by the number and types of feature defects found using said imaging action.

According to some but not necessarily all embodiments, there is provided: A substrate writing system, comprising: a substrate writing tool, comprising multiple charged particle beam columns, ones of said columns being configured to produce a charged particle beam to write a substrate using calculated adjustments to beam writing parameters, different ones of said beams targeting different corresponding portions of the substrate; and a substrate inspection tool, comprising: multiple charged particle beam columns, ones of said columns being configured to produce a charged particle beam, different ones of said beams targeting different corresponding portions of the substrate; and one or more beam controllers configured to: vector ones of said beams to corresponding ones of multiple critical dimension control targets within said corresponding portions, image the substrate using scanning of said vectored beams in a raster-like pattern across said corresponding critical dimension control targets, while substantially skipping other substrate areas, and calculate said adjustments to beam writing parameters for respective ones of said beams in at least partial dependence on said imaging and on a position of a stage, wherein different ones of said beam controllers differently and simultaneously control different ones of said beams to perform said vectoring and said imaging.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Some exemplary parameters are disclosed hereinabove (e.g., device sizes, feature density and numbers of columns) to illustrate the relations between these and other parameters. However, it will be understood by a person of ordinary skill in the art that these values are merely illustrative.

In some embodiments, features to be inspected can be partially or entirely determined from the design layout template, or from previous inspection results corresponding to the design layout template or to a lithography tool used to pattern the wafer being inspected.

In some embodiments, care-area size can depend at least partially on previous inspection results corresponding to the design layout template or to a lithography tool used to pattern the wafer being inspected.

In some embodiments, a charged particle beam can image a care-area, critical dimension control target, or fiducial mark using other raster-like scan patterns, such as scanning across the care-area in alternating scan line directions (i.e., boustrophedonically) and incrementally moving the beam in a roughly orthogonal direction relative to the wafer as each long stripe is completed.

In some embodiments, a visually-interpretable or displayable image or other pixel-assemblage is generated by rastering across a feature or other beam target, and analyzed to identify and/or categorize actual or possible defects or other target features, fiducial marks, or critical dimension targets, and for the other purposes described hereinabove; in some embodiments, only a partial visually-interpretable or displayable image or other pixel-assemblage is generated; in some embodiments, an "image" represents image data from inspection, but is not a visually-interpretable or displayable image; in some embodiments, different combinations of these (no, partial, full image) are generated; in some embodiments, charged particle detection data, raw or processed into a non-image form, is analyzed, alone or in combination with image data.

In some embodiments, a charged particle beam can perform a low resolution imaging pass using a predefined regular pattern other than a raster pattern, such as a raster-like pattern (e.g., boustrophedonically), or a non-raster-like pattern, such as a spiral. (A raster pattern is also an example of a predefined regular pattern.)

In some embodiments, a vector scan plus raster scan inspection phase can be followed by a higher resolution vector scan plus raster scan phase.

In some embodiments, a lower resolution fast raster inspection phase is applied only to parts of the patterned wafer area.

In some embodiments, vector scan plus raster scan inspection can be applied to micro- or nano-repairing or implantation of silicon or non-silicon substrates.

In some embodiments, the size and location of a care-area can be based, partially or entirely, on the image of the corresponding feature identified as requiring detailed inspection obtained during a lower resolution raster scan phase.

Application to wafers and substrates has been variously described herein. It will be apparent to those skilled in the art that the inventions disclosed herein are applicable to semiconductor wafers and also to other lithography-amenable substrates.

Application to patterned wafers (or substrates) has been described herein. It will be apparent to those skilled in the art that the disclosures herein regarding inspection are applicable to written and unwritten substrates (in which case, an identified feature for fine detail inspection can be, e.g., a defect or likely defect in a blank substrate surface).

The inventions disclosed herein have been described with respect particularly to electron beam columns. However, it will be apparent to those skilled in the art that the disclosed inventions can be applied to various charged particle beam technologies, including, but not limited to, miniature, non-magnetic, electrostatically-driven electron beam columns.

In some embodiments, pattern features other than contact holes, cut lines, and other cut features can be designated as requiring inspection and be part of care-areas.

In some embodiments, defects not coinciding with a pattern feature can be designated as requiring inspection and can be part of care-areas.

In some embodiments, substrate imaging for inspection and/or lithography is performed while the stage holding the substrate is moving.

In some embodiments, substrate imaging for inspection and/or lithography is performed while the stage holding the substrate is stationary.

In some embodiments, the number of columns in a multiple electron beam column array can depend, for example, on column size, substrate size, and sampling density. Sampling density is dependent on the pattern resolution at a given technology node.

In some embodiments, features may be selected for fine detail inspection depending on the lithography and inspection history of the design and/or the particular lithography tool used to pattern the wafer.

In some multiple column embodiments, one local control computer corresponds to more than one column (e.g., two columns or four columns per local control computer). Pre-partitioned design data and control responsibilities can be stored by and allocated to a local computer based on the particular wafer portions inspected by the respective multiple columns controlled by the computer.

In some embodiments, possible defects can be classified by local computers during or after a fast raster scan as, for example, definitely defective and not in need of rescan; probably not defective but in need of rescan because of feature importance; possibly defective and not in need of rescan because of, e.g., a very low probability of defect, or the possible defect is located in a die part with redundant functionality that can be easily shifted to other die parts; possibly defective and in need of rescan; by severity; or by type (such as void defect or particle defect).

In some embodiments, features may be selected for fine detail inspection depending on particular characteristics of the design such as feature size, location or importance.

In some multiple column embodiments, adjacent columns inspect overlapping wafer areas.

In some multiple column embodiments, columns are not arranged in a grid pattern.

In some multiple column embodiments, a die is inspected by a single column.

In some multiple column embodiments, a die is inspected by multiple columns.

In some embodiments, inspection using fine detail vector scan plus raster scan imaging can be used to perform pattern fidelity maintenance processes other than alignment and critical dimension control.

In some multiple column embodiments, the center-to-center column spacing is typically 30 mm×30 mm, but could be 24 mm×33 mm or some other spacing.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, as well as some features which can be implemented synergistically with the inventions claimed below, may be found in the following US patent applications. All of these applications have at least some common ownership, copendency, and inventorship with the present application, and all of them, as well as any material directly or indirectly incorporated within them, are hereby incorporated by reference: U.S. Pat. No. 6,355,994; U.S. Pat. No. 6,617,587; U.S. Pat. No. 6,734,428; U.S. Pat. No. 6,738,506; U.S. Pat. No. 6,777,675; U.S. Pat. No. 6,844,550; U.S. Pat. No. 6,872,958; U.S. Pat. No. 6,943,351; U.S. Pat. No. 6,977,375; U.S. Pat. No. 7,122,795; U.S. Pat. No. 7,227,142; U.S. Pat. No. 7,435,956; U.S. Pat. No. 7,456,402; U.S. Pat. No. 7,462,848; U.S. Pat. No. 7,786,454; U.S. Pat. No. 7,928,404; U.S. Pat. No. 7,941,237; U.S. Pat. No. 8,242,457; and U.S. Pat. No. 8,384,048.

The claims as filed are intended to be as comprehensive as possible, and NO subject matter is intentionally relinquished, dedicated, or abandoned.

What is claimed is:

1. A method for inspecting a substrate using multiple charged particle beams produced by multiple columns, comprising the actions of:
   a) imaging the substrate, including substrate locations identified as care-areas in step b), at a low resolution using scanning of the beams in a predefined regular pattern across the substrate, different ones of the beams targeting different corresponding portions of the substrate;
   b) identifying one or more care-areas on the substrate, with which at least one associated defect database is populated, using said low resolution imaging;
   c) vectoring ones of the beams to corresponding ones of said care-areas within said corresponding portions without using said predefined regular pattern; and
   d) imaging the substrate at a high resolution using scanning of the vectored beams in a raster-like pattern across said corresponding care-areas, while substantially skipping non-care-areas,
   wherein steps c) and d) are performed differently and simultaneously by different ones of the beams.

2. The method of claim 1, wherein said predefined regular pattern is a raster-like pattern.

3. The method of claim 1, wherein, during inspection, step d) images less than $\frac{1}{10}^{th}$ of the written area of the substrate.

4. The method of claim 1, wherein steps a), c) and d) are performed in the same vacuum space.

5. The method of claim 1, wherein said charged particle beam columns are electron beam columns.

6. The method of claim 1, wherein different ones of said columns are controlled by different ones of multiple local column control computers.

7. The method of claim 6, wherein said local column control computers, corresponding to ones of the beams produced by respective ones of the columns, store and analyze substantially only portions of the design layout template written to said corresponding portions.

8. A method for inspecting a substrate using multiple charged particle beams produced by multiple columns, comprising the actions of:
   a) imaging the substrate, including substrate locations identified as care-areas in step b), at a low resolution using scanning of the beams in a predefined regular pattern across the substrate, different ones of the beams targeting different corresponding portions of the substrate;
   b) identifying one or more care-areas on the substrate, with which at least one associated defect database is populated, using said low resolution imaging; and
   c) imaging the substrate at a high resolution using scanning of the vectored beams in a raster-like pattern across said care-areas, while substantially skipping non-care-areas,
   wherein steps a) and c) are performed differently and simultaneously by different ones of the beams.

9. The method of claim 8, wherein the wafer stage moves during steps a) and c).

10. The method of claim 8, wherein ones of the columns produce individual ones of the charged particle beams.

11. The method of claim 8, wherein at least some care-areas are identified in at least partial dependence on at least one of the design layout template, previous inspection results corresponding to the design layout template, and previous inspection results of a lithography tool used to pattern the wafer being inspected.

12. The method of claim 8, wherein different ones of said columns are controlled by different ones of multiple local column control computers.

13. The method of claim 12, wherein said local column control computers, corresponding to ones of the beams produced by respective ones of the columns, store and analyze substantially only portions of the design layout template written to said corresponding portions.

* * * * *